(12) United States Patent
Corzine et al.

(10) Patent No.: US 6,526,082 B1
(45) Date of Patent: Feb. 25, 2003

(54) P-CONTACT FOR GAN-BASED SEMICONDUCTORS UTILIZING A REVERSE-BIASED TUNNEL JUNCTION

(75) Inventors: Scott W. Corzine, Sunnyvale, CA (US); Richard P. Schneider, Jr., Mountain View, CA (US); Ghulam Hasnain, Union City, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/586,406

(22) Filed: Jun. 2, 2000

(51) Int. Cl.$^7$ .................................................. H01S 5/00
(52) U.S. Cl. ...................................................... 372/46
(58) Field of Search .............................. 372/44, 45, 43, 372/46, 47; 257/103, 106

(56) References Cited

U.S. PATENT DOCUMENTS

| | | | |
|---|---|---|---|
| 4,169,997 A | * 10/1979 | Logan et al. | 331/94.5 |
| 4,904,039 A | * 2/1990 | Soref | 350/96.14 |
| 5,365,536 A | * 11/1994 | Seki | 372/45 |
| 5,452,316 A | * 9/1995 | Seki et al. | 372/46 |
| 5,636,234 A | * 6/1997 | Takagi | 372/43 |
| 5,892,784 A | * 4/1999 | Tan et al. | 372/43 |
| 5,926,585 A | * 7/1999 | Irikawa et al. | 385/14 |
| 5,930,133 A | * 7/1999 | Morizuka | 363/126 |
| 5,966,396 A | * 10/1999 | Okazaki et al. | 372/46 |
| 5,990,500 A | * 11/1999 | Okazaki | 257/99 |
| 6,020,602 A | * 2/2000 | Sugawara et al. | 257/103 |
| 6,121,639 A | * 9/2000 | Van de Walle | 257/103 |
| 6,157,049 A | * 12/2000 | Mitlehner et al. | 257/77 |
| 6,369,403 B1 | * 4/2002 | Holnyak, Jr. | 257/13 |

\* cited by examiner

*Primary Examiner*—Paul Ip
*Assistant Examiner*—Davienne Monbleau
(74) *Attorney, Agent, or Firm*—Patent Law Group LLP; Brian D. Ogonowsky; Rachel V. Leiterman

(57) ABSTRACT

A light-generating device such as a laser or LED. A light-generating device according to the present invention includes a first n-electrode layer in contact with a first n-contact layer, the first n-contact layer including an n-doped semiconductor. Light is generated by the recombination of holes and electrons in an n-p active layer. The n-p active layer includes a first p-doped layer in contact with a first n-doped layer, the first n-doped layer being connected electrically with the first n-contact layer. A p-n reverse-biased tunnel diode constructed from a second p-doped layer in contact with a second n-doped layer is connected electrically such that the second p-doped layer is connected electrically with the first p-layer. A second n-contact layer constructed from an n-doped semiconductor material is connected electrically to the second n-doped layer. A second n-electrode layer is placed in contact with the second n-contact layer. The various layers of the invention can be constructed from GaN semiconductors. The p-n reverse-biased tunnel diode includes an n-depletion region in the second n-doped layer and a p-depletion region in the second p-doped layer, the n-depletion region and the p-depletion region in contact with one another. The conductivity of the reverse-bias tunnel diode may be increased by doping the n-depletion region and p-depletion region. The conductivity of the reverse-bias tunnel diode can also be increased by including a compressively strained InGaN layer in the n-depletion region.

9 Claims, 6 Drawing Sheets

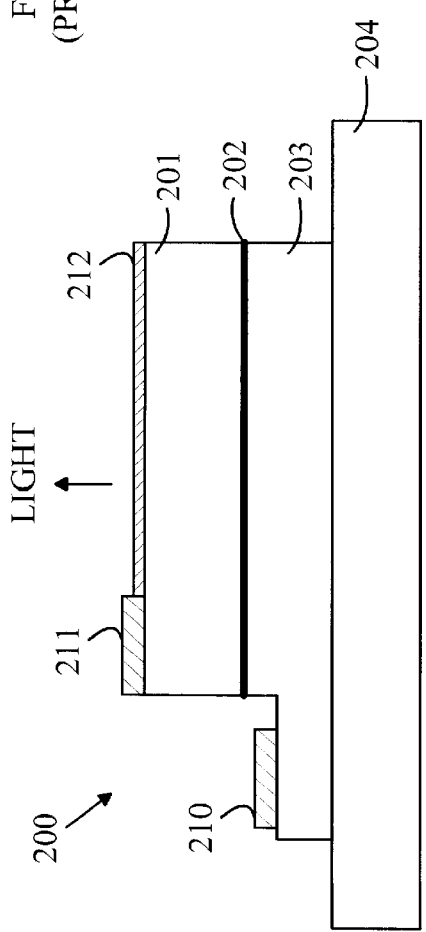
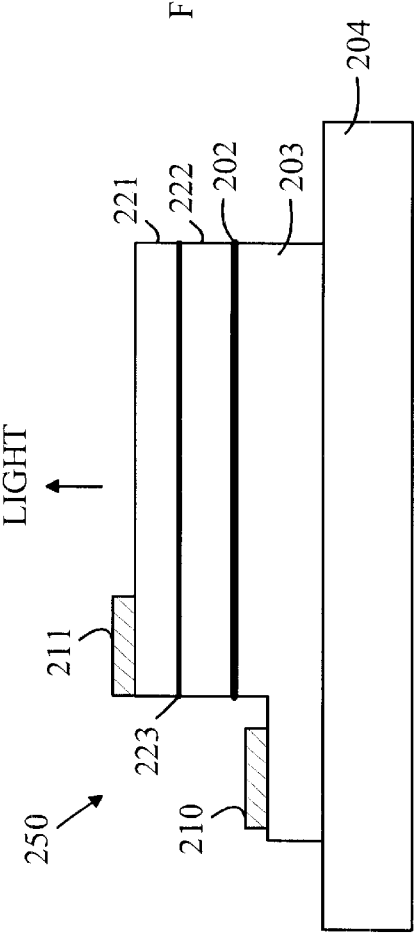

P-CONTACT FOR GAN-BASED SEMICONDUCTORS UTILIZING A REVERSE-BIASED TUNNEL JUNCTION

FIELD OF THE INVENTION

The present invention relates to semiconductor lasers and light emitting diodes, and more particularly, to an improved p-contact with such devices.

BACKGROUND OF THE INVENTION

The development of short wavelength light emitting devices is of great interest in the semiconductor arts. Such short wavelength devices hold the promise of providing increased storage density for optical disks as well as full-color displays and white light sources when used in conjunction with devices that emit light at longer wavelengths. For example, blue lasers are expected to increase the storage density of optical disks by a factor of three.

One promising class of short wavelength light emitting devices is based on group III–V semiconductors, particularly group III nitride semiconductors. As used herein, the class of group III nitride semiconductors includes GaN, AlN, InN, BN, AlInN, GaInN, AlGaN, BAlN, BInN, BGaN, and BAlGaInN. To simplify the following discussion, "GaN semiconductors" includes GaN, and group III nitride semiconductors whose primary component is the GaN as in GaInN, AlGaN, BGaN, and BAlGaInN.

Light emitting diodes (LEDs) and semiconductor laser diodes are fabricated on epitaxially grown layers of GaN and related alloys of semiconductor materials including an active layer that generates light by recombining holes and electrons. The active layer is sandwiched between p-type and n-type contacts to form a p-n or n-p diode structure. A p-electrode and an n-electrode are used to connect the p-contact and n-contact, respectively, to the power source used to drive the device. The overall efficiency of the device may be defined to be the light emitted to the outside generated per watt of drive power. To maximize the light efficiency, both the light generated per watt of drive power in the active layer and the amount of light exiting from the device in a useful direction must be considered.

It should be noted that the resistance of the p-type nitride semiconductor layer is much more than the resistance of the n-type nitride semiconductor layer. The resistivity of the p-contact layer is typically 100 to 1000 times that of the n-contact nitride semiconductor. When the p-electrode is formed on the p-type nitride semiconductor layer, a Schottky junction or ohmic junction is formed. In either case, there is a voltage drop across the junction, and hence, power is wasted at the junction. In GaN blue lasers, this voltage drop can be 10–20V. The power dissipated at the p-contact is sufficient to limit the continuous power that can be generated by the device. In addition, the power dissipated at the p-contact does not generate any light; hence, the high resistivity of the p-contact layer reduces the overall efficiency of the device.

In GaN based LEDs, the p-contact is also the layer through which light is extracted from the device. The high resistivity of the p-contact material requires that the p-electrode cover substantially all of the p-contact layer since lateral current spreading is minimal. Hence, the light is forced to exit through the p-electrode. Even when very thin electrode layers are utilized, a substantial fraction of the light generated in the LED is absorbed by the p-electrode. Accordingly, the efficiency of the LED is substantially reduced.

Broadly, it is the object of the present invention to provide improved LEDs and semiconductor lasers based on group III–V semiconductors.

It is a further object of the present invention to provide light emitting devices with increased light output efficiency.

It is yet another object of the present invention to provide a p-contact structure that reduces the problems associated with the prior art structures discussed above.

These and other objects of the present invention will become apparent to those skilled in the art from the following detailed description of the invention and the accompanying drawings.

SUMMARY OF THE INVENTION

The present invention is a light-generating device such as a laser or LED. The light generating device includes a first n-electrode layer in contact with a first n-doped contact layer that includes an n-doped semiconductor. Light is generated in an n-p active layer in response to the recombination of holes and electrons in the n-p active layer. The n-p active layer includes a first p-doped active layer in contact with a first n-doped active layer, the first n-doped active layer being connected electrically with the first n-doped contact layer. A p-n reverse-biased tunnel diode that includes a second p-doped layer is in contact with a second n-doped layer, the second p-doped layer is connected electrically with the first p-doped active layer. A second n-electrode layer is in contact with the second n-doped layer. The first n-doped contact layer and the second n-doped layer are preferably GaN semiconductors. The p-n reverse bias tunnel diode preferably includes an n-depletion region in the second n-doped layer and a p-depletion region in the second p-doped layer, the n-depletion region and the p-depletion region being in contact with one another. In one embodiment, the n-depletion region includes a compressively strained InGaN layer.

BRIEF DESCRIPTION OF THE DRAWINGS

FIG. 4 is a simplified cross-sectional view of a prior art GaN LED 200.

FIG. 5 illustrates a LED 250 according to the present invention.

DETAILED DESCRIPTION OF THE INVENTION

Figure 1:
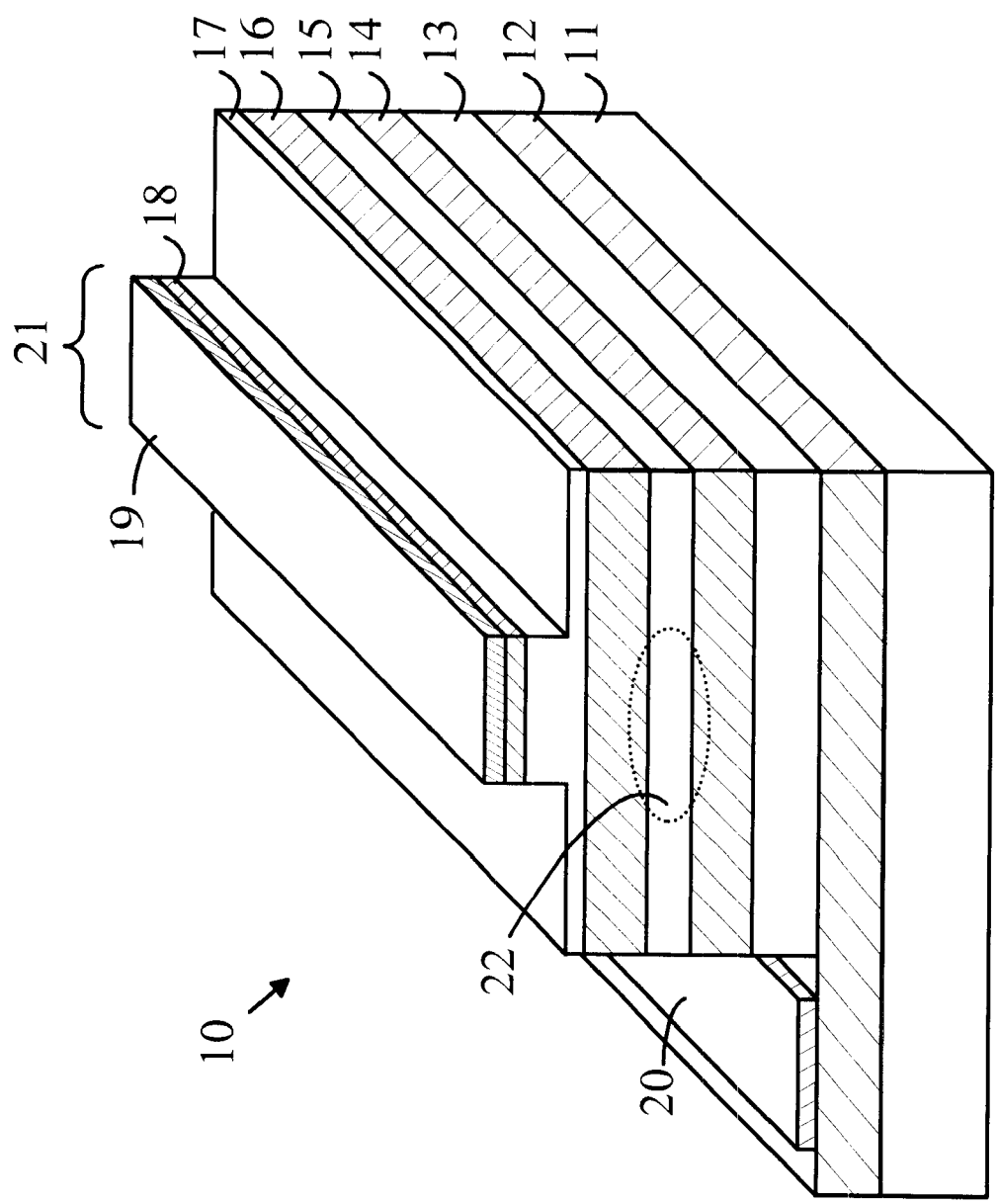
FIG. 1 is a perspective view of an edge-emitting semiconductor laser 10.

The manner in which the present invention provides its advantages may be more easily understood with reference to FIG. 1 which is a perspective view of an edge-emitting semiconductor laser 10. Laser 10 is an example of a specific laser geometry that facilitates low threshold and single lateral mode operation. Laser 10 is constructed on a substrate 11 by growing a number of epitaxial layers on substrate 11. For GaN lasers, the n-type layers are typically constructed first. The first layer is the n-contact layer 12 followed by an n-cladding layer 13. The active layer consisting of a guide layer 14, the light generation layer 15, and a second guide layer 16 are then deposited. A p-cladding layer 17 and a p-contact layer 18 are then deposited on the p-guiding layer 16. A metallic electrode layer 19 is deposited on the p-contact layer to provide one of the electrical connections. The layered stack is then etched to form the ridge structure shown at 21 and to expose the n-contact layer on which metallic electrode 20 is deposited. The light is confined to region 22 by the cladding layers and ridge structure.

As noted above, the voltage drop across the junction between the p-electrode and p-contact layer is very high for GaN based materials. This voltage drop can be half of the total voltage applied between electrodes 19 and 20. The corresponding drop across the n-electrode and n-contact, however, is very low. The present invention is based on the observation that the problems associated with the p-contact junction would be eliminated if the p-contact junction could be replaced with an n-contact junction.

Figure 2:
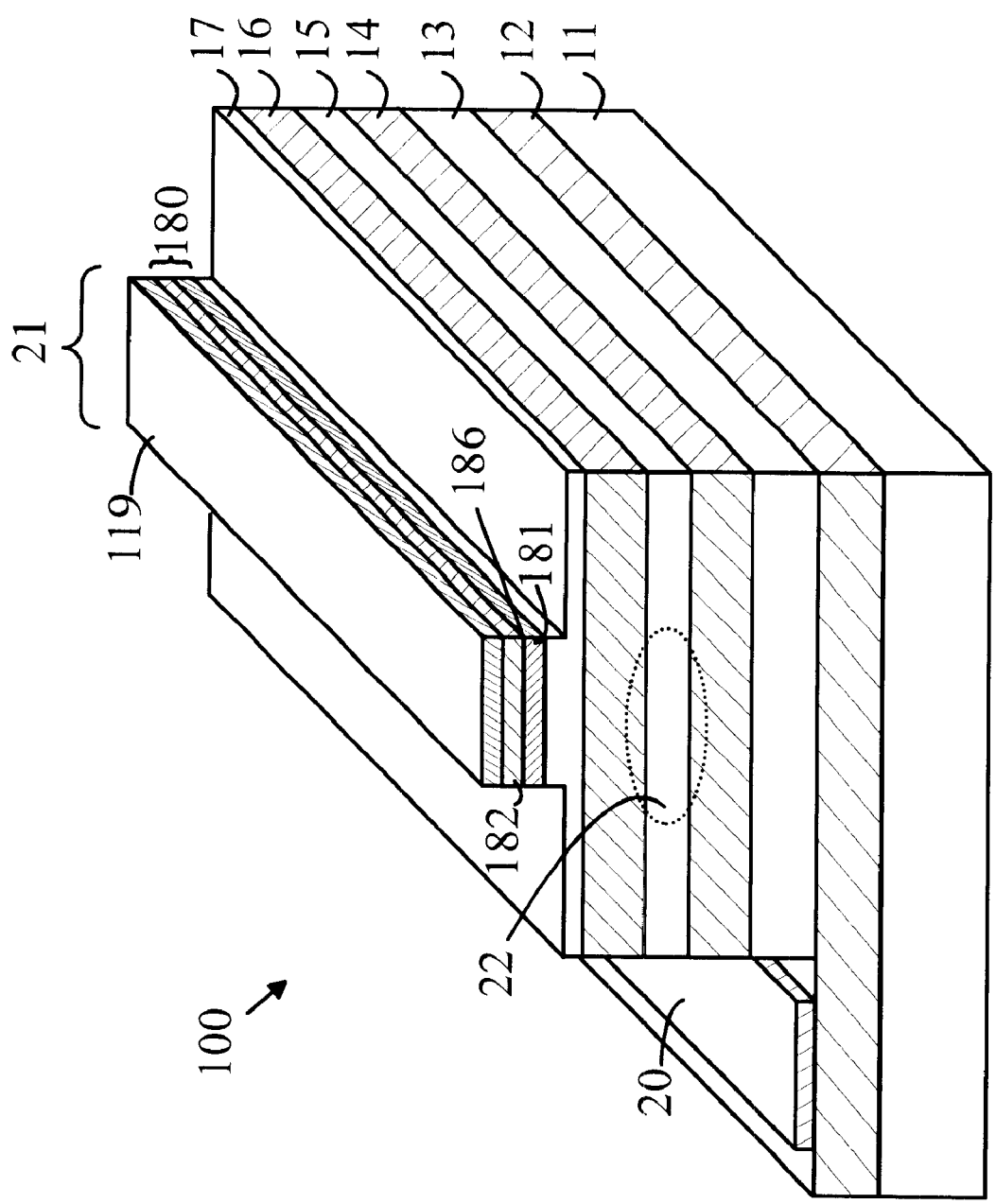
FIG. 2 shows the present invention with the p-contact layer replaced by an n-p tunnel diode.

In the present invention, the p-contact layer is replaced by an n-p tunnel diode as shown in FIG. 2 at 100. To simplify the following discussion, those elements of laser 100 that serve the same function as elements shown in FIG. 1 for laser 10 have been given the same numerical designations. Laser 100 differs from laser 10 in that the p-contact layer 180 has been replaced by a reverse-biased tunnel diode 186 consisting of an n-layer 182 and a p-layer 181. Electrode 119 is constructed from the same material as electrode 20, and hence, the voltage drop across the junction between electrode 119 and n-layer 182 is typical of an n-contact, i.e., a small fraction of a volt.

Figure 3:
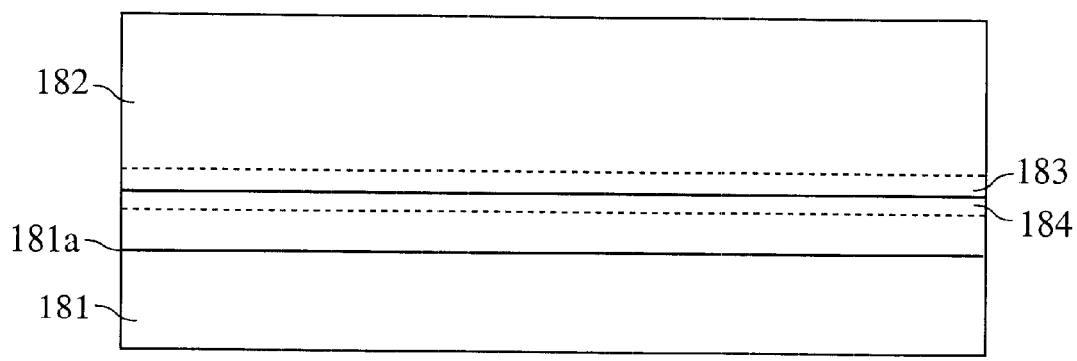
FIG. 3 shows an expanded view of the tunnel diode, which is a cross-sectional view of layers 181 and 182.

To provide an improvement over prior art lasers, the tunnel diode between layers 181 and 182 must have a lower voltage drop than the p-contact junction of the prior art devices. An expanded view of the tunnel diode is shown in FIG. 3, which is a cross-sectional view of layers 181 and 182. The tunneling current is enhanced in the preferred embodiment of the present invention by doping the depletion region between layers 181 and 182 to enhance the electric fields in the depletion region. Region 183 is preferably doped with Si atoms to a density of $10^{19}$ atoms/cm$^3$ or greater. Similarly, the p-side of the depletion region 184 is doped with Mg atoms to a density of $10^{19}$ atoms/cm$^3$ or greater.

A second method for enhancing the tunnel diode to further increase the conductivity of the junction utilizes the large piezoelectric fields generated by strained InGaN layers. To provide enhanced tunneling, the strained layer is inserted in the tunnel diode so that the piezoelectric field points in the direction that will enhance the tunneling. This embodiment of the present invention is based on the observation that compressively strained InGaN induces a piezo-electric field which points toward the substrate for typical growth conditions on sapphire substrates. The field direction depends on whether the GaN crystals grow with Ga face or N face exposed. In conventional OMVPE (Organo-Metallic Vapor Phase Epitaxy) growth, the Ga face is commonly exposed which yields a field pointing to the substrate in InGaN compressively strained layers.

In essence, the piezo-electric field induced by the compressively strained InGaN layer adds and enhances the built-in field of the junction, which will increase the band-bending and enhances the tunneling current. Thus, the insertion of an InGaN layer somewhere in the depletion layer creates a more effective tunnel junction. In the preferred embodiment of the present invention, the strained layer (e.g., 181a shown in FIG. 3) is inserted on the p-side of the depletion region.

The reverse-bias tunnel diode of the present invention can also be used to improve the efficiency of GaN based LEDs. Referring to FIG. 4, which is a simplified cross-sectional view of a prior art GaN LED 200. LED 200 may be viewed as a p-n diode having an active layer 202 at the junction of the p-layer 201 and n-layer 203. The diode is typically constructed on a sapphire substrate 204. To simplify the drawing, the various sub-layers of active layer 202 have been omitted. The sub-layers are well known to those skilled in the art. Power is applied to the LED via electrodes 210 and 211. Electrode 210 connects to n-layer 203 which has a very low resistivity. Electrode 211 connects to p-layer 201. Unfortunately, as noted above, p-doped GaN materials have very high resistivities. The resistivity of p-layer 201 is so high that it inhibits the spreading of the current from electrode 211 into active layer 202. Hence, to provide uniform current flow, a thin semi-transparent layer 212 of conductor is deposited over p-layer 201 and connected to electrode 211. While this thin layer of conductor solves the current spreading problem, it absorbs a portion of the light generated by LED 200. As much as half of the light is absorbed by this layer; hence, this prior art solution reduces the efficiency of the LED by as much as a factor of 2.

Refer now to FIG. 5, which illustrates a LED 250 according to the present invention. To simplify the drawing, those elements of LED 250 that serve the same function as elements shown in FIG. 4 have been given the same numeric designations. In LED 250, the p-layer shown at 201 in FIG. 4 has been replaced by an n-p reverse bias tunnel diode consisting of n-layer 221, p-layer 222, and tunnel diode 223. Since the n-doped GaN of layer 221 has a low resistivity, there is no longer any need for an electrode, such as electrode 212 shown in FIG. 4, to spread the current from the contact electrode 211. Accordingly, LED 250 will have a higher efficiency than LED 200 if the power loss across tunnel diode 223 is less than half the power dissipated by the device.

A reverse bias tunnel diode according to the present invention can also be utilized to reduce the power losses incurred in overcoming the resistivity of the p-doped layers in semiconductor lasers. Referring again to FIG. 2, laser 100 utilizes a reverse bias tunnel diode located in the ridge region of the laser within the area normally containing the p-contact layer. Hence, cladding layer 17 is composed of a p-doped material, usually p-AlGaN. This material also has a very high resistivity, typically higher than that of comparably doped p-GaN. In addition, the thickness of the layer is determined by the wavelength of the light generated by the laser and the difference in index of refraction between the cladding layer and the guide layer under it. As a result, the power losses across the cladding layer cannot be reduced by decreasing the thickness of the layer. The power losses across the p-doped cladding layer can be 25% of the power dissipated by the laser.

Figure 6:
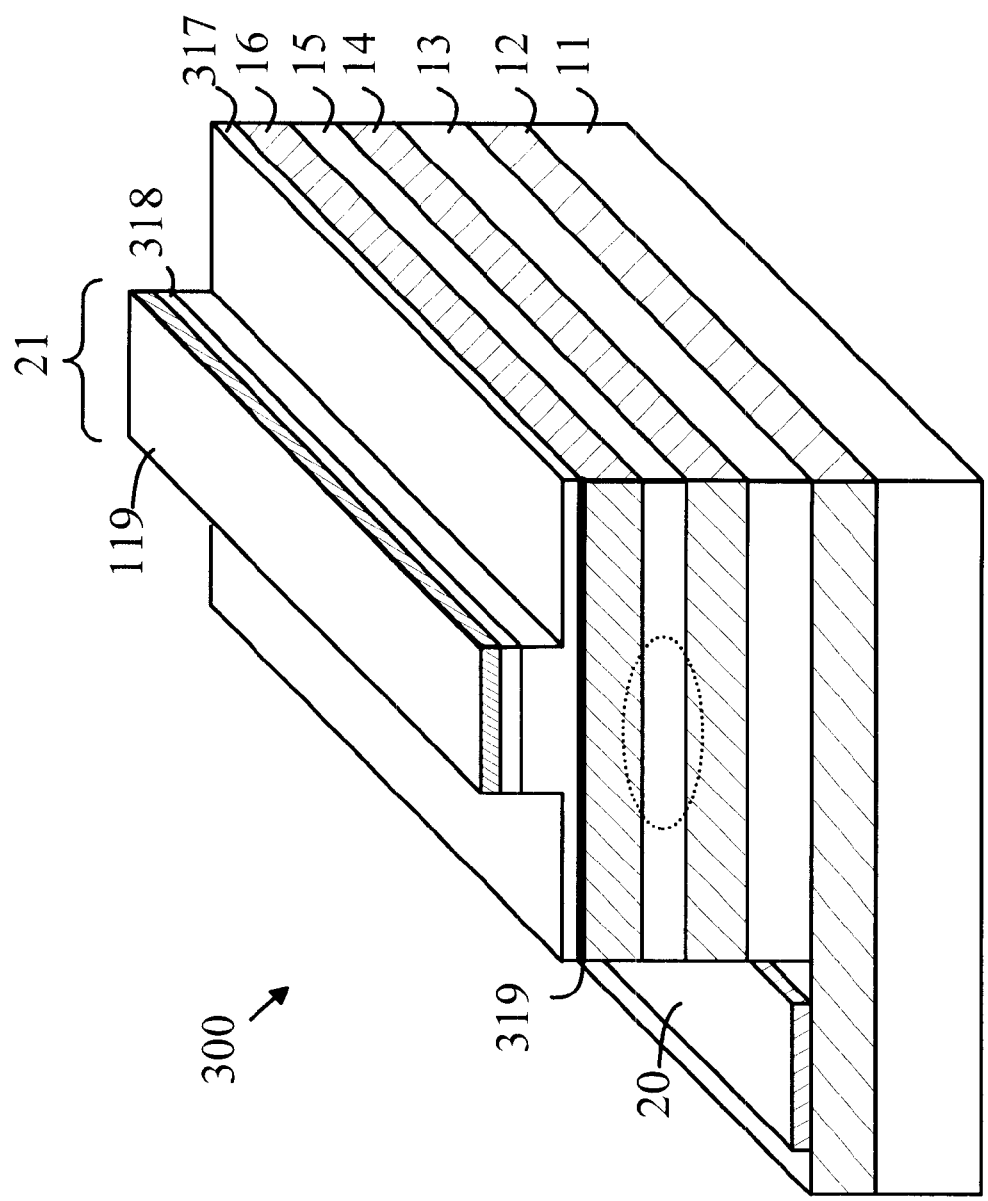
FIG. 6 is a prospective view of a laser 300 according to the present invention in which the reverse bias tunnel diode is located close to the active region.

Refer now to FIG. 6, which is a perspective view of a laser 300 according to the present invention in which the reverse bias tunnel diode is located close to the active region. To simplify the drawing, those elements of laser 300 that serve the same function as elements shown in FIG. 1 have been given the same numeric designations. In laser 300, the reverse bias tunnel diode 319 is located between the cladding layer 317 and the active layer consisting of layers 14–16. This arrangement allows the cladding layer 317 and contact layer 318 to be constructed from low resistivity n-doped GaN materials, and hence, the voltage drop associated with the p-cladding layer in a conventional GaN-based laser is substantially reduced.

The reverse bias tunnel diode of the present invention facilitates the construction of an "upside down" laser that provides a substantial improvement over the conventional laser shown in FIG. 1 because of increased current confinement. As noted above, large piezoelectric fields are generated by strained InGaN layers, such as the InGaN layer in the active region of the laser. In prior art lasers constructed by growing the n-doped layers on sapphire substrates, the piezoelectric field points toward the substrate. Unfortunately, this field direction causes the current flow pattern to diverge. If the piezoelectric field pointed in the opposite direction, the field would enhance the current containment. To provide the opposite field direction, prior art laser designs required the p-doped layers to be adjacent to the sapphire substrate. As noted above in the discussion of LEDs, the p-doped material has a very high resistivity, which interferes with the current spreading from the p-electrode into the p-contact layer. Hence, merely turning the laser upside down does not provide a significant advantage, since the improvement in current confinement obtained by the optimum orientation of the piezoelectric field is offset by the poor current spreading from the p-electrode into the p-contact layer.

Figure 7:
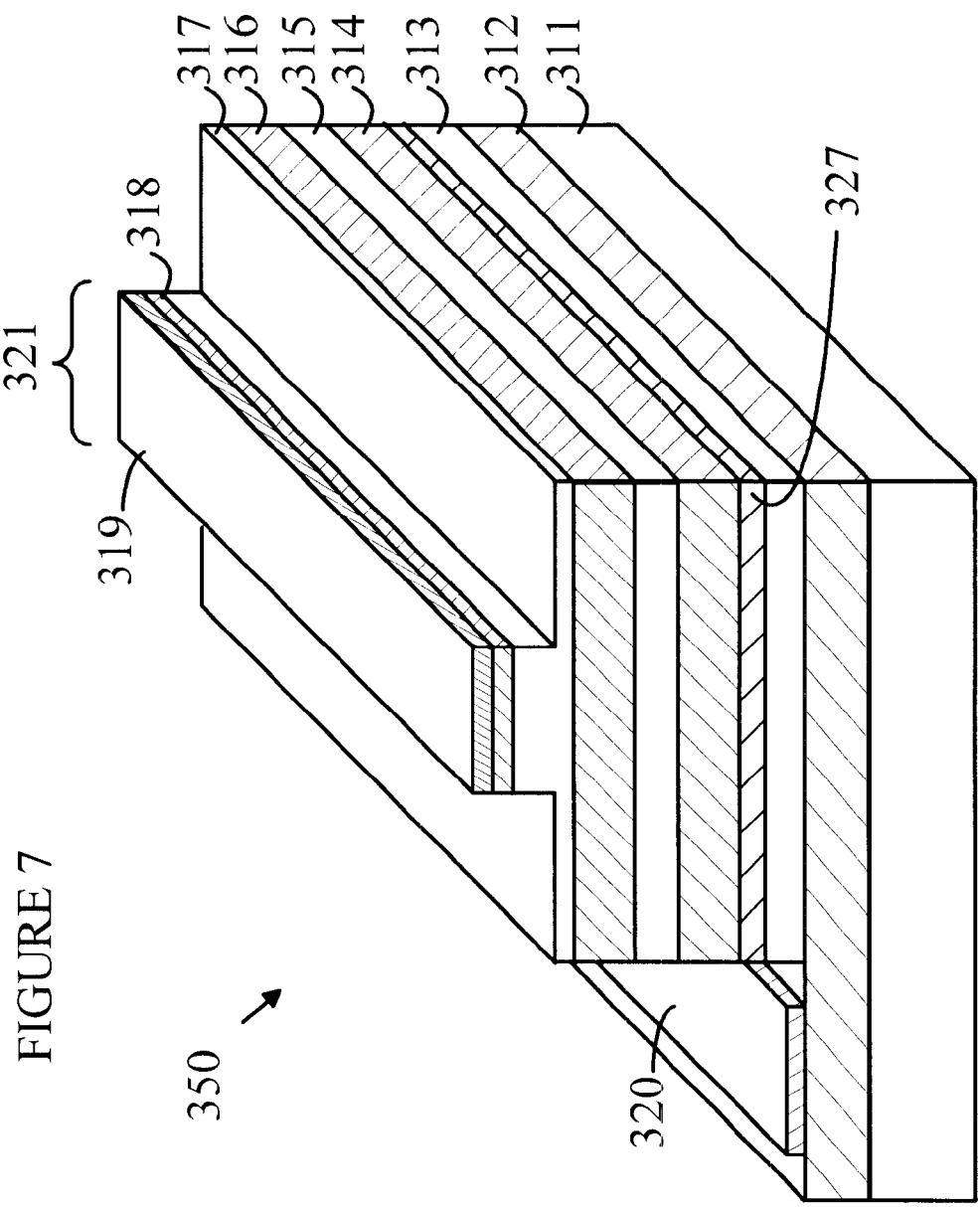
FIG. 7 is a prospective view of a laser 350 according to another embodiment of the present invention.

Refer now to FIG. 7, which is a perspective view of a laser 350 according to another embodiment of the present invention. Laser 350 utilizes a reverse bias tunnel diode to enable an upside-down arrangement in which the piezoelectric field points in the proper direction to provide increased current confinement. Laser 350 is constructed by depositing an n-contact layer 312 on a sapphire substrate 311. An n-cladding layer 313 is then deposited on n-contact layer 312 and a p-cladding layer 327 is deposited on n-cladding layer 313. The reverse-biased tunnel diode junction is located at the interface of layers 327 and 313 in this embodiment of the present invention. The active region consisting of p-guide layer 314, active layer 315, and n-guide layer 316 is then deposited. A second n-cladding layer 317 and a second n-contact layer 318 are then deposited. The layered stack is then etched to provide ridge region 321 on which an n-electrode 319 is deposited. The second electrical contact 320 is deposited on the first n-contact layer after the stack is etched back to expose layer 312. Electrode 320 is also an n-electrode. Since the resistivity of the n-contact layer 312 is much lower than that of the p-contact layer used in a conventional laser, the current spreading problems associated with a conventional upside-down laser are eliminated. This also applies to LEDs, which are similar in layer structure but without the AlGaN cladding layers. In the case of LEDs, the better carrier confinement obtained with the piezo-electric field reversed relative to the direction of carrier flow, results in less carrier overflow, and hence, increased quantum efficiency at higher current density. This results in a considerable cost advantage by increasing the amount of light flux emitted per unit chip area.

While the discussion of laser 350 utilized a specific location for the reverse bias tunnel diode, it will be obvious to those skilled in the art from the preceding discussion that other locations can be utilized without deviating from the teachings of the present invention. For example, the reverse bias tunnel diode can be placed anywhere between the active region and the n-contact.

Various modifications to the present invention will become apparent to those skilled in the art from the foregoing description and accompanying drawings. Accordingly, the present invention is to be limited solely by the scope of the following claims.

What is claimed is:

1. A light generating device comprising:
   a first n-electrode layer;
   an active region for generating light in response to the recombination of holes and electrons in said active region, said active region comprising a first p-doped layer comprising GaN and a first n-doped layer comprising GaN, said first n-doped layer being connected electrically with said first n-electrode;
   a reverse-biased tunnel diode comprising a second n-doped layer comprising GaN and connected electrically with said first p-doped layer; and
   a second n-electrode layer connected electrically with said second n-doped layer.

2. The light generating device of claim 1 further comprising an n-cladding layer in contact with said first n-doped layer and a p-cladding layer in contact with said first p-doped layer.

3. The light generating device of claim 2 wherein said n-cladding layer and said p-cladding layer comprise GaN semiconductors.

4. The light generating device of claim 1 wherein said reverse-biased tunnel diode comprises an n-depletion region in said second n-doped layer and a p-depletion region in a p-doped layer comprising GaN and adjacent to said second n-doped layer, said n-depletion region and said p-depletion region in contact with one another.

5. The light generating device of claim 4 wherein said n-depletion region is doped to a density of $10^{19}$ atoms/cm$^3$ or greater with Si.

6. The light generating device of claim 5 wherein said p-depletion region is doped with Mg atoms to a density of $10^{19}$ atoms/cm$^3$ or greater.

7. The light generating device of claim 1 wherein said reverse-biased tunnel diode comprises a compressively strained InGaN layer.

8. The light generating device of claim 1 further comprising a substrate, wherein said second n-doped layer is disposed between said substrate and said first p-doped layer.

9. The light generating device of claim 1 further comprising a substrate, wherein said first p-doped layer is disposed between said substrate and said second n-doped layer.

* * * * *